United States Patent [19]

Naylor

[11] Patent Number: 4,607,249
[45] Date of Patent: Aug. 19, 1986

[54] INPUT LEVEL SHIFTING CIRCUIT FOR LOW VOLTAGE DIGITAL-TO-ANALOG CONVERTER

[75] Inventor: Jimmy R. Naylor, Tucson, Ariz.

[73] Assignee: BBRR-Brown Corporation, Tucson, Ariz.

[21] Appl. No.: 732,162

[22] Filed: May 8, 1985

[51] Int. Cl.[4] .............................................. H03M 1/00
[52] U.S. Cl. ...................... 340/347 DA; 340/347 CC; 340/347 M
[58] Field of Search ................. 340/347 DA, 347 CC, 340/347 M

[56] References Cited

U.S. PATENT DOCUMENTS 4,423,409 12/1983 Naylor et al. ............... 340/347 DA
4,543,561 9/1985 Holloway ..................... 340/347 DA
4,556,870 12/1985 Brokaw et al. .......... 340/347 CC X Primary Examiner—William M. Shoop, Jr.
Assistant Examiner—Sharon D. Logan
Attorney, Agent, or Firm—Cahill, Sutton & Thomas

[57] ABSTRACT

A low voltage sixteen bit digital-to-analog converter operable between +5 and −5 volt power supplies and capable of providing output voltage levels to within about 1.4 volts of $+V_{CC}$ and $-V_{CC}$ includes an input level shifting circuit that provides precise switching of a bit current switch circuit by producing a precise voltage drop across a level shifting resistor by drawing a current that is adjusted to compensate for variations in resistance of the level shifting resistors due to process parameter variations and temperature variations.

7 Claims, 4 Drawing Figures

INPUT LEVEL SHIFTING CIRCUIT FOR LOW VOLTAGE DIGITAL-TO-ANALOG CONVERTER

CROSS-REFERENCE TO RELATED APPLICATIONS

This application is related to the co-pending application "Bit Adjustment and Filter Circuit for Digital-To-Analog Converter" by Jimmy Ray Naylor and Frederick J. Highton and the application, "Low Voltage Digital-To-Analog Converter" by Jimmy Ray Naylor and David F. Mietus, both filed on even date herewith and assigned to the present assignee.

BACKGROUND OF THE INVENTION

The invention relates to low voltage integrated circuit digital-to-analog converters, and especially to input level shifting circuits therefore.

Various digital-to-analog converter circuits are known. As the state-of-the-art has advanced, monolithic digital-to-analog converters (DACs) capable of increased accuracy, greater bandwidth (i.e., operating speed), and capable of operating from fairly low magnitude power supply voltages have been developed. Nevertheless, further improvements in each of these areas are highly desirable in order to broaden the markets for DACs, by making it economically practical to use DACs in a larger range of low cost products. It is highly desirable to provide in a monolithic integrated circuit, particularly a monolithic DAC, the capability of operating (within predetermined specifications) not only from very low magnitude power supply voltages, but also from very high magnitude power supply voltages. Providing such capability in an integrated circuit, particularly in a monolithic DAC, imposes various difficulties upon the circuit designer. For example, provision of the capability of operating from low magnitude power supply voltages often presents the problem of generating adequate internal operating voltages in response to "worst case" TTL input signals. Use of low magnitude power supply voltages also makes it difficult to generate the maximum output voltages that usually are required. The term "head room" is sometimes used by those skilled in the art to describe the problem of obtaining suitable output signal levels in an integrated circuit when either or both of the power supply voltages are low, for example, +4.75 volts or −4.75 volts. It is difficult to generate adequately high output voltages if the circuit has little "head room" when a low positive power supply voltage is used. The same is true for a negative output swing when the negative supply is a low voltage. For a large positive output swing, the emitter-to-base voltage of an NPN pullup transistor must be included in the "head room", and a prior circuit stage must be provided to drive the base of the NPN pullup transistor. For modern, high speed, low power circuitry, those skilled in the art will recognize that such prior stages of circuitry also require adequate "head room" to accommodate the various emitter-to-base voltage drops and collector-to-emitter voltage drops that are needed to produce the signal that drives the base of the NPN pullup transistor. A similar condition applies to the NPN pulldown transistor.

When the power supply voltages ($+V_{CC}$ and/or $-V_{CC}$) are at a very high magnitude level, for example at $+15$ to $+18$ volts (or $-15$ to $-18$ volts), then, during certain operating conditions the collector-to-emitter breakdown voltages of the pullup and pulldown transistors are likely to be exceeded. This is likely to occur because typically, the normal collector-to-emitter breakdown voltage of the pullup and pulldown transistors, when they are "on", is roughly 20 volts for a typical high speed bipolar manufacturing process, and the collector-to-emitter voltages of the pullup and pulldown transistors exceeds this value if $+V_{CC}$ is $+15$ volts or higher and $-V_{CC}$ is $-15$ volts or more negative. To overcome this problem, additional active devices, such as transistors and zener diodes, have been provided in series with the pullup and pulldown transistors to "absorb" some of the collector-to-emiter overvoltages that would otherwise be applied to the pullup and pulldown transistors and cause them to break down. Both zener diode voltage drops and collector-to-emitter voltage drops have been provided in series relationship with the pullup and pulldown transistors to avoid the breakdowns that occur when high power supply voltages are applied to push-pull output circuits. The provision of such additional circuitry greatly complicates a circuit design, making the circuit more costly, often reducing its speed, increasing its power consumption, and reducing the "head room" needed to obtain adequate output signal levels. Another constraint faced by circuit designers of monolithic integrated circuits is the limited number of pins or leads of economical packages in which the chips must be housed. For monolithic DACs, it is often desirable to provide a capability of connecting external components, such as potentiometers, to effectuate precise adjustment of bit currents, as may be required in certain practical applications of monolithic DACs. It also may be desirable to attach external capacitors to effectuate filtering of noise signals, since provision of large internal filtering capacitors in a monolithic integrated circuit is impractical due to the large amount of chip area required for integrated circuit capacitors.

Thus, it can be seen that there is a continuing need for improved circuit design techniques and structures which make it possible to provide circuit operation at specified high speeds, over a wide range of power supply voltages, with minimum circuit complexity, while requiring minimum area monolithic chip area to accomplish these goals.

There is a special need for an improved amplifier output structure that provides the cpability of operation from both high magnitude and low magnitude power supply voltages and is capable of operating with minimum "head room" in order to produce the highest possible signal voltage levels when the positive and/or negative power supply voltage magnitudes are low.

Another major problem always faced by monolithic circuit designers in the complication produced by the requirement of providing circuit designs which not only meet the foregoing requirements, but also meet them over a wide range of temperatures.

Prior DACs have had relatively large negative power supply voltages from which to develop voltages across precision resistors that determine bit currents and from which to operate current switches that selectively sum the bit currents to produce an analog output current in response to the digital inputs. Some prior DACs have used zener diodes having breakdown voltages of approximately seven volts to shift TTL input levels down to the lower voltage levels required to control the bit current switches. This technique cannot be used if the negative power supply voltage is not substantially greater in magnitude than the zener diode breakdown voltage. Although resistive level shifting techniques have been used for various purposes, they have not been used where constant voltage level shifting is required in monolithic integrated circuits, probably because of loss of switching speeds and inadequate control of the voltage level shifts due to processing variations.

SUMMARY OF THE INVENTION

It is an object of the invention to provide improved, low voltage, TTL compatible level shifting circuit for driving bit current switches of a DAC, which level shifting circuit is insensitive to manufacturing process variations, power supply voltage variations, and changes in operating temperature.

Briefly described, and in accordance with one embodiment thereof, the invention provides a TTL compatible input level shifting circuit that includes a diode having its cathode connected to a digital input terminal of a digital to analog converter and its anode connected to the input of an NPN emitter follower transistor, and having its anode connected by a pullup resistor to a first reference voltage. A level shifting resistor is connected between the emitter of the NPN emitter follower transistor and a compensated current source circuit that causes a current through the level shifting resistor to produce an essentially constant voltage drop across the level shifting resistor, despite variations in manufacturing process parameters and variations in operating temperature. The lower voltage terminal of the level shifting resistor is connected to the base of one transistor of an emitter-coupled NPN transistor pair. The base of the other transistor of the emitter-coupled pair is connected to a second reference voltage. The emitter-coupled NPN transistor pair switches a bit current into an output current summing node if the digital input level is low, and into a ground conductor if the digital input level is high.

DESCRIPTION OF THE INVENTION

Figure 1:
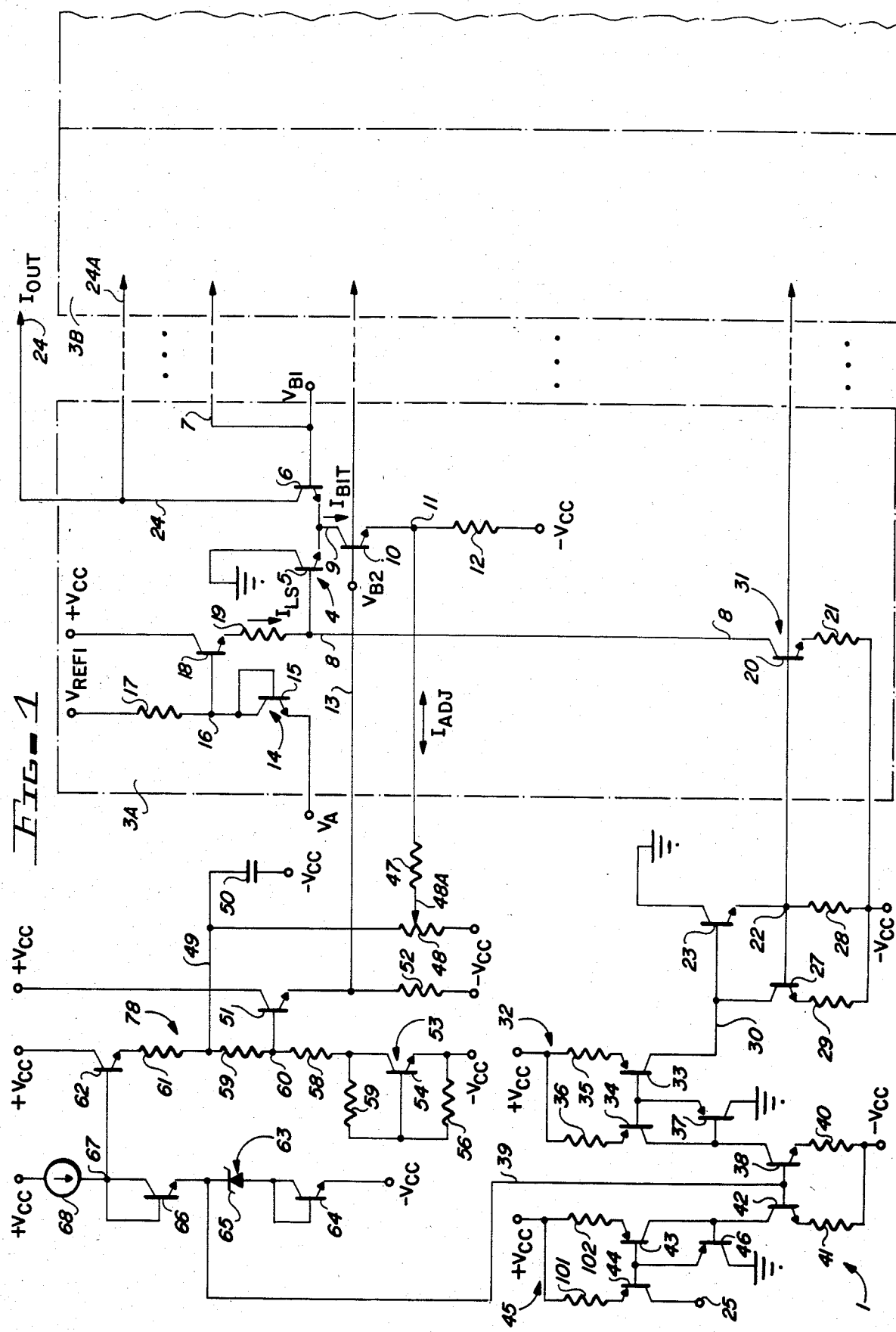
FIG. 1 is a schematic diagram of a portion of a digital to analog converter which is a subject of the present invention.
Figure 2:
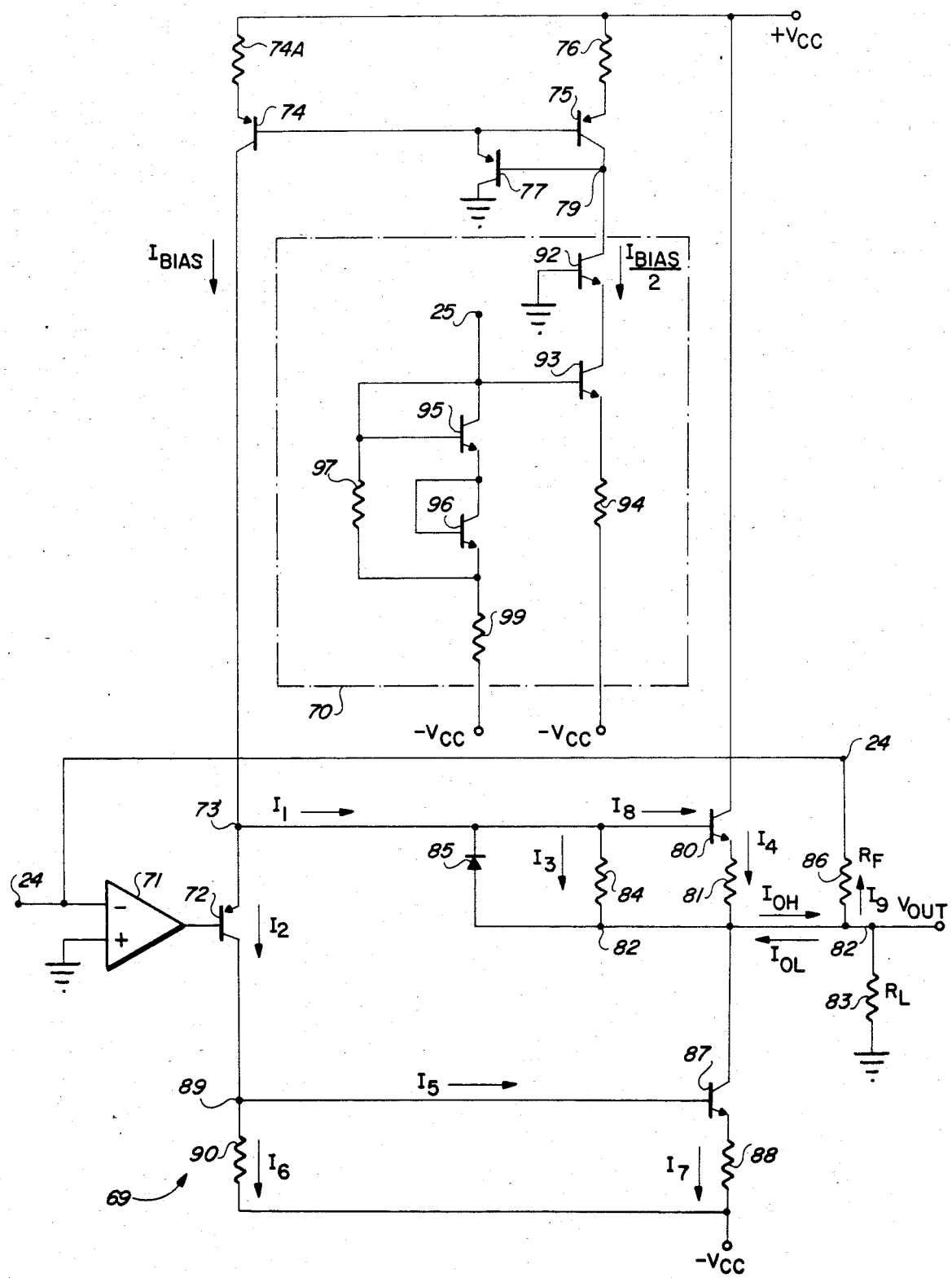
FIG. 2 is a schematic diagram of an output amplifier circuit which receives an analog summing current produced by the circuit of FIG. 1.

Referring now to FIGS. 1 and 2, digital to analog converter 1 includes a plurality of digital input terminals, such as input terminal 2, which are connected to a plurality of individual "bit circuits", such as bit circuit 3A. For example, if DAC 1 is a 16 bit DAC, there will be 16 "bit circuits" such as 3A, and 16 separate digital input terminals such as input terminal 2. In FIG. 1, only one bit circuit 3A is described in detail. The bit circuit 3A is the most significant bit in described DAC 1. Remaining bit circuits, such as 3B, are essentially similar to bit circuit 3A, except that they are not necessarily connected to a "bit current adjustment circuit", subsequently described. Appropriate binary bit current scaling by means of a conventional R-2R resistor ladder network is conventional, and is not shown.

Bit circuit 3A includes a precision resistor 12 connected between $-V_{CC}$ (the negative supply voltage conductor) and conductor 11. Conductor 11 is connected to the emitter of NPN "current source" transistor 10. The base of the current source transistor 10 of each of the bit circuits is connected to a conductor 13, which produces a temperature compensated bias voltage $V_{B2}$ thereon. The collector of current source transistor 10 of each bit circuit is connected to a conductor 9, which in turn is connected to the emitters of two NPN transistors, 5 and 6, which constitute an "emitter coupled pair". Transistors 5 and 6 function as a bit current switch. The collector of bit current switch transistor 5 is connected to ground, and the collector of bit current switch transistor 6 is connected to a current summing conductor 24. Conductor 24A is connected in a conventional manner to receive other bit currents in an R-2R resistor ladder circuit. The base of transistor 5 is connected by conductor 8 to a level shifting circuit that shifts the voltage levels controlled by $V_A$ down to the levels required for proper operation of the base of bit current switch transistor 5. For each of the bit circuits, bit current $I_{BIT}$ is supplied in resistor 12 by the current source transistor 10, and is switched either to ground, when the base of transistor 5 is high, or into current summing conductor 24 when the base of transistor 5 is at a low voltage. The sum of all of the bit currents is an analog output current $I_{OUT}$. $I_{OUT}$ is applied to the negative input of a high gain differential amplifier 71, shown in FIG. 2.

A bias voltage $V_B$ is applied to the base of bit current switch transistor 6 of each of the bit circuits such as 34. Conventional temperature tracking bias circuitry can be provided easily by those skilled in the art to provide the bias voltage $V_{B1}$ applied to conductor 7.

Each of the bit circuits includes an input level shifting circuit including a diode 15, a pullup resistor 17, an NPN emitter follower transistor 18, a level shifting resistor 19, and a temperature compensated current source circuit 31.

A TTL compatible input voltage $V_A$ is applied to the emitter of diode-connected NPN transistor 15, the collector and base of which are connected by conductor 16 to pullup resistor 17 and NPN transistor 18. The upper terminal of resistor 17 is connected to a suitable reference voltage $V_{REF1}$. The collector of transistor 18 is connected to $+V_{CC}$, and the emitter thereof is connected by a nichrome resistor 19 to conductor 8. Conductor 8 is connected to the collector of an NPN transistor 20 of current source 31.

Current source circuit 31, by itself, is a one output of NPN current mirror circuit that is conventional; it includes NPN transistors 20, 23, and 27, with emitter resistors 21, 28, and 29, respectively. The bases of transistors 20 and 27 are connected to the emitter of transistor 23, the base of which is connected to the collector of transistor 27 by means of conductor 30. The current supplied to in the collector of transistor 27 determines the current $I_{LS}$ in the collector of transistor 20, and also in the transistors such as 20 in the other bit circuits, which are not shown. The current in transistor 27 is determined by a separate PNP current mirror circuit 32. PNP current mirror circuit 32 includes PNP transistors 33 and 34 having their bases connected to the emitter of a PNP transistor 37. The base of transistor 37 is connected to the collector of PNP transistor 34. The emitters of transistors 33 and 34 are connected by emitter resistors 35 and 36 to $+V_{CC}$. The current through transistor 34, and hence transistor 33 and transistor 27 of current mirror 31, is determined by a precision nichrome resistor 40 that ratio-matches the shape and structure of the above mentioned nichrome resistor 19 of level shifting circuit 14. Resistor 40 is connected between the emitter of NPN transistor 38 and $-V_{CC}$. The collector of transistor 38 is connected to the collector and base of PNP transistors 34 and 37, respectively.

The base of transistor 38 is connected by conductor 39 to the cathode of a zener diode 65, which is included in a voltage reference circuit 63, in which current source 68 biases a string of components including temperature compensating diodes 64 and 66 and positive temperature coefficient zener diode 65.

Conductor 39 is also connected to the base of NPN transistor 42, which has a nichrome resistor 41 connected between the emitter of NPN transistor 42 and $-V_{CC}$. Nichrome resistor 41 is ratio-matched to resistor 97, subsequently described with reference to FIG. 2. The collector of transistor 42 is connected to a second PNP current mirror circuit 45, which is essentially similar to PNP current mirror circuit 32, and includes PNP transistors 43 and 44 having their bases connected to the emitter of PNP transistor 46, the base of which is connected to the collectors of transistors 42 and 43. The emitters of transistors 43 and 44 are coupled by resistors 102 and 101, respectively, to $+V_{CC}$. The collector of transistor 44 is connected by conductor 25 to the bias control circuit 70 subsequently described with reference to FIG. 2.

FIG. 1 also includes a circuit, designated by reference numeral 78, for generating the above mentioned bias voltage $V_{B2}$ on conductor 13 and for also effectuating precise bit current adjustment of one (or more) of the bit circuits of DAC 1. Circuit 78 includes an NPN emitter follower transistor 62 having its base connected to a reference voltage conductor 67 and having its emitter coupled by a 500 ohm resistor 61 to conductor 49. Conductor 49 is connected by a 6.15 kilohm resistor 59 to conductor 60, and conductor 60 is connected by means of a 3.35 kilohm resistor 58 to conductor 57. Conductor 57 is connected by means of a $V_{BE}$ multiplier circuit 53 to $-V_{CC}$. $V_{BE}$ multiplier circuit 53 includes an NPN transistor 54 having its emitter connected to $-V_{CC}$, its base connected by resistor 56 to $-V_{CC}$ and also connected to its collector by resistor 55. The collector of transistor 54 is also connected to conductor 57.

Conductor 60 is connected to the base of NPN transistor 51, the emitter of which is connected by resistor 52 to $-V_{CC}$. The emitter of transistor 51 is also connected to $V_{B2}$ conductor 13.

Conductor 49 is connected to an external filter capacitor 50 to $-V_{CC}$. Conductor 49 is also coupled by external potentiometer 48 to $-V_{CC}$. Potentiometer 48 has a variable resistance terminal 48A that is connected by resistor 47 to conductor 11.

Referring now to FIG. 2, previously mentioned differential amplifier 71 has its positive input connected to ground. Its output is connected to a push-pull unity gain output stage referred to by reference numeral 69. The circuitry of amplifier 71 is entirely conventional, and can be readily provided by those skilled in the art. Various typical low power, high gain differential amplifier circuits can be utilized to implement amplifier 71.

The output of amplifier 71 is connected to the base of PNP transistor 72, the emitter of which is connected to conductor 73 and the collector of which is connected by conductor 89 to the base of NPN pull-down transistor 87 and by resistor 90 to $-V_{CC}$. The emitter of pull-down transistor 87 is connected by resistor 88 to $-V_{CC}$.

Conductor 73 is connected to the collector of a PNP current source transistor 74, the emitter of which is coupled by emitter resistor 74A to $+V_{CC}$. Conductor 73 is also connected to the base of NPN pullup transistor 80, the collector of which is connected to $+V_{CC}$. PNP transistor 72 acts as an emitter follower which drives the base of NPN pullup transistor 80. The emitter of pullup transistor 80 is connected by 24 ohm resistor 81 to output conductor 82, on which an output voltage $V_{OUT}$ is produced. External load resistor $R_L$ is designated by reference numeral 83, and couples conductor 82 to ground. A feedback resistor 86, having value $R_F$, is coupled between output conductor 82 and conductor 24.

A 2 kilohm resistor 84 is connected between the base of pullup transistor 80 and output conductor 82. The anode of diode 85 is connected to conductor 82 and the cathode thereof is connected to conductor 73.

A temperature compensated bias current $I_{BIAS}$, which is constant at a particular temperature, is produced in the collector of PNP current mirror transistor 74. Transistor 74 has its base connected to the base of PNP transistor 75 and the emitter of PNP transistor 77. The emitter of transistor 74 is connected by resistor 74A to $+V_{CC}$. The emitter of transistor 75 is connected by resistor 76 to $+V_{CC}$, and the collector of transistor 75 is connected by conductor 79 to the base of transistor 77, and to the collector of NPN transistor 92. Transistors 74, 75 and 77 form a PNP current mirror circuit, the currents in which are controlled by the circuitry including NPN transistors 93, 95, and 96, and by the current mirror circuit 45 shown in FIG. 1. The emitter area of transistor 74 is twice that of transistor 75, so a current equal to $I_{BIAS}/2$ is caused (by transistor 93 and resistor 94) to flow in the collector of transistor 75, and twice that current, i.e., $I_{BIAS}$, is caused to flow in the collector of transistor 74. Resistor 97 is connected between conductors 25 and 98.

The base of NPN transistor 92 is connected to ground, and its emitter is connected to the collector of transistor 93. The emitter of transistor 93 is coupled by resistor 94 to $-V_{CC}$. The base of transistor 93 is connected by conductor 25 to the collector and base of diode-connected NPN transistor 95. Diode-connected transistor 96 has its collector and base connected to the emitter of transistor 95 and it has its emitter connected to conductor 98. A 48 ohm resistor 99 is connected between conductor 98 and $-V_{CC}$.

Exemplary values of the various components shown in the circuit of FIGS. 1 and 2 are shown in Table 1.

TABLE 1

| Component | Value |
| --- | --- |
| Resistor 17 | 10 Kilohms for MSB; 20 kilohms for other bits |
| Resistor 19 | 4.25 kilohms for two MSBs, 8.7 kilohms for other bits |
| Resistor 21 | 1.6 kilohms |
| Resistor 28 | 5 kilohms |
| Resistor 29 | 1.6 kilohms |
| Resistor 35 | 925 ohms |
| Resistor 36 | 800 ohms |
| Resistor 40 | 27 kilohms |
| Resistor 41 | 27 kilohms |
| Resistor 55 | 13.4 kilohms |
| Resistor 56 | 5.4 kilohms |

TABLE 1-continued

| Component | Value |
| --- | --- |
| Resistor 58 | 3.35 kilohms |
| Resistor 59 | 6.15 kilohms |
| Resistor 61 | 500 ohms |
| Resistor 74A | 250 ohms |
| Resistor 76 | 500 ohms |
| Resistor 81 | 24 ohms |
| Resistor 84 | 2 kilohms |
| Resistor 86 | 5 kilohms |
| Resistor 88 | 24 ohms |
| Resistor 90 | 2 kilohms |
| Resistor 94 | 1.65 kilohms |
| Resistor 97 | 9 kilohms |
| Resistor 99 | 48 ohms |
| Capacitor 50 | .1 microfarads |

Next, the operation of the output push-pull stage 69 of FIG. 2 will be described. In understanding the operation of push-pull output stage 69, it is important to realize that the monolithic DAC 1, represented by the circuit schematic diagrams of FIGS. 1 and 2, is to be processed with a "standard" monolithic bipolar integrated circuit manufacturing process in which the "normal" collector-to-emitter breakdown voltage $BV_{CEO}$ of the NPN transistors is roughly 18 volts to 22 volts. The various resistors can, for example, be thin film nichrome resistors or difused P type resistors formed during the same operation in which the base regions of the NPN transistors are formed.

NPN pullup transistor 80 has its collector connected directly to $+V_{CC}$, rather than being coupled in series with other circuitry which would absorb some of the excess collector-to-emitter voltage that otherwise would be applied to transistor 80 when NPN pulldown transistor 87 pulls $V_{OUT}$ to a voltage approaching $-V_{CC}$, and the resulting difference between $V_{OUT}$ and $+V_{CC}$ exceeds the normal collector-to-emitter breakdown voltage.

As used herein, the term "normal" or "on" collector-to-emitter breakdown voltage of an NPN transistor refers to a collector-to-emitter breakdown voltage when that transistor is considered to be "on" and is conducting an appreciable collector current, for example at least 0.1 milliamperes.

In accordance with an important aspect of the present invention, NPN pulldown transistor 87 has its emitter coupled to $-V_{CC}$ by a small value (24 ohms) resistor 88, and has its collector connected directly to output conductor 82, rather than by means of additional circuitry that would absorb excess collector-to-emitter overvoltage that otherwise would be applied in the event that pullup transistor 80 pulls $V_{OUT}$ to a value approaching $+V_{CC}$, and the resulting difference between $V_{OUT}$ and $-V_{CC}$ exceeds the "normal" collector-to-emitter breakdown voltage of pulldown transistor 87.

Those skilled in the art will appreciate that, in an NPN transistor with a collector current of greater collector-base than approximately 50 microamperes, impact ionization occurring in the collector-base depletion region can lead to the avalanche phenomena, greatly reducing the breakdown voltage of that transistor such as 80 or 87.

Figure 4:
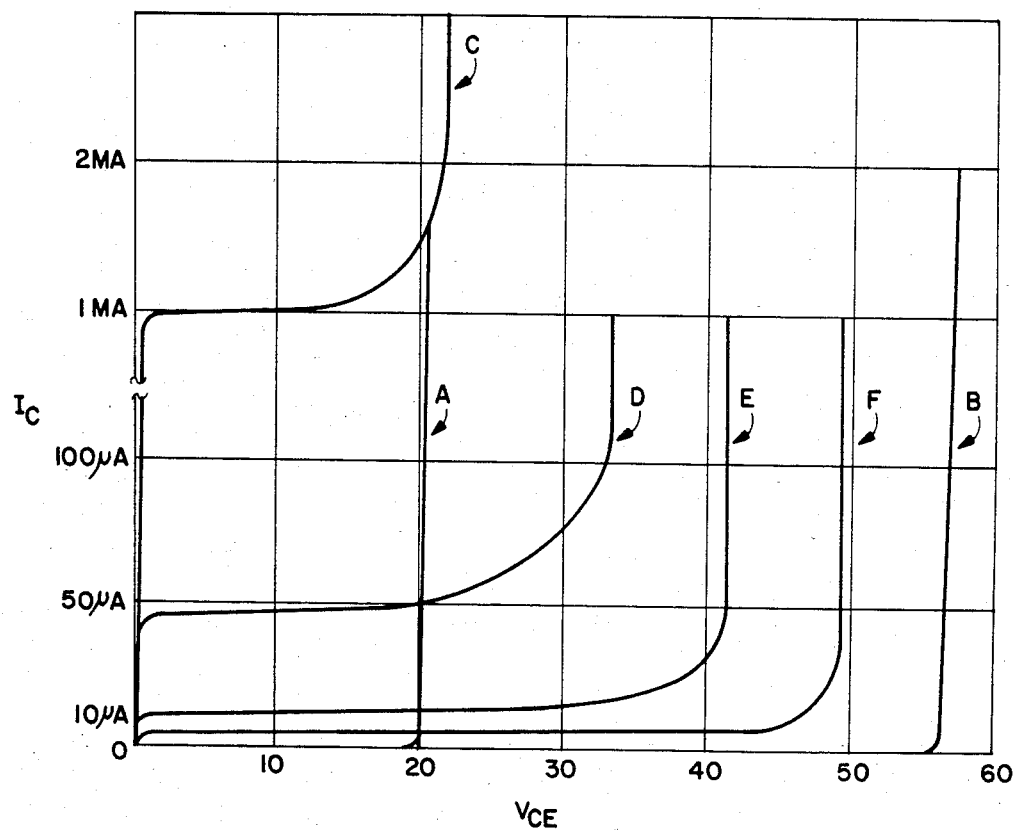
FIG. 4 is a diagram showing the collector-to-emitter breakdown characteristics of an NPN transistor as a function of its base current and collector current.

The manner in which the collector-to-emitter breakdown voltage varies with collector current and base current will be discussed with reference to FIG. 4, as an understanding of this will be helpful to understanding the operation of the push-pull output stage of FIG. 2. Referring now to FIG. 4, the $I_C$ (collector current) versus $V_{CE}$ (collector to-emitter) voltage characteristic of a typical NPN transistor, such as pullup transistor 80, is shown. Curve A shows the $BV_{CEO}$ (collector-to-emitter breakdown voltage with base open) characteristic of pullup transistor 80 (or pulldown transistor 87). For collector currents in excess of a few microamperes, $BV_{CEO}$ is about 20 volts. Curve B is the $BV_{CES}$ (collector-to-emitter breakdown voltage with base shorted to emitter) characteristic. At collector currents in excess of a few microamperes, $BV_{CES}$ is about 56 volts. Those skilled in the art know that $BV_{CEO}$ is much lower than $BV_{CES}$ because reverse collector base junction leakage current flows into the base region of the transistor and is multiplied by the current gain "beta" of the transistor, producing a greatly amplified (by a factor of several hundred) collector current that causes impact ionization to occur at a collector-to-emitter voltage of about 20 volts. This causes rapid avalanche breakdown, which in turn often causes destruction of the transistor and/or other harmful effects.

Curves C, D, E and F represent $BV_{CER}$ (collector-to emitter breakdown voltages with a 2 kilohm resistor connected between the base and emitter) with successively lower values of constant current drive into the base and 2 kilohm resistor when it is tested by means of a conventional curve tracer.

The resistors 84 and 90 of FIG. 2 thus affect the collector-to-emitter breakdown voltage of pullup transistor 80 and pulldown transistor 87, respectively, when they are off. It can be seen that turning pullup transistor 80 or pulldown transistor 87 nearly off when the other one of them is supplying or sinking a high output current doesn't necessarily increase its collector-to-emitter breakdown voltage as evidenced by curve A in FIG. 4. In addition to turning the transistor off or essentially off, a path has to be provided to shunt the collector-base leakage current out of the base to prevent the beta multiplication in order to increase the collector-to-emitter breakdown voltage toward $BV_{CES}$ as indicated by curve F of FIG. 4. With this background, the operation of the push-pull circuit of the present invention can proceed.

Under quiescent operating conditions, in which the analog summing junction current or DAC output current $I_{OUT}$ is zero, $V_{OUT}$ is zero volts. Then, assuming room temperature operation, $I_{BIAS}$ is about 0.7 milliamperes. The current through $R_L$ is zero. The current $I_4$ through pullup transistor 80 is about 0.5 milliamperes and the current through resistor 84 is about 0.35 milliamperes. Therefore, the current $I_7$ (the sum of $I_3$ and $I_4$) in pulldown transistor 87 is about 0.85 milliamperes. Since $I_3$ is about 0.35 milliamperes $I_2$ is also about 0.35 milliamperes. (It is assumed that all of the base currents are negligible.) Hence. $I_6$ is also about 0.35 milliamperes.

Several examples of the operation of the output state will now be given.

First, if the analog current $I_{OUT}$ (conductor 24) has a sufficiently large value to cause $V_{OUT}$ to be driven to +10 volts, then the current through $R_L$ ($R_L$=5 kilohms) is increased to about 2 milliamperes from the zero quiescent value. The current $I_q$ through $R_F$ is 1 milliampere. Then $I_{OH}$ is 3 milliamperes. Our computer simulation results show that the current $I_4$ is about 2.6 milliamperes. Then $I_3$, and hence $I_1$, are increased to about 0.4 milliampere due to the increase in the sum of the voltage drop across resistor 81 and the $V_{BE}$ of transistor 80 and an essentially equal increase in the voltage drop across resistor 84. This causes $I_2$, and hence $I_6$, to be decreased to about 0.3 milliampere, since $I_{BIAS}$ is constant with respect to changes in output current, thus reducing the voltage between the base of transistor 87 and $-V_{CC}$ to bout 0.6 volt which causes pulldown transistor 87 to be nearly off. Thus, the feedback through resistor 81 and emitter of pullup transistor 80 causes a reduction in $I_2$ in response to the increase in output current supplied by pullup transistor 80 essentially turns off pulldown transistor 87. This reduction in $I_2$ results in a low enough voltage across resistor 90 that the voltage drop across low resistance (2 kilohm) shunt resistor 90 allows the collector-base reverse leakage current to flow out of the base of pulldown transistor 87, substantially increasing its collector-to-emitter breakdown voltage, as explained above with reference to FIG. 4. Our computer simulations show that this results in about 0.2 microampere of current flowing through pulldown transistor 87, greatly increasing its breakdown voltage.

As a second example, with $R_L$ increased from 5 kilohms to infinity, and with $V_{OUT}$ equal to +10 volts, and $+V_{CC}$ equal to +15 volts, and $-V_{CC}$ equal to $-15$ volts, our simulations show that the current $I_4$ is about 0.65 milliampere, $I_3$ and hence $I_1$, are increased very slightly from the 0.35 milliampere quiescent value and $I_2$ is decreased slightly from its quiescent value. (The "worst case" or highest value of $I_7$ through pulldown transistor 87 occurs when $R_L$ is infinite.) This results in a decrease in the forward bias voltage on the base of pulldown transistor 87, leading to a decreased value of $I_7$ of approximately 20 microamperes. This worst case value of $I_7$ increases the collector-to-emitter breakdown voltage of pulldown transistor 87 well beyond the 25 volt collector-to-emitter voltage being applied to pulldown transistor 87 (in accordance with FIG. 4), despite the higher value of current $I_7$ compared to the previous example.

As a third example, assume that the input value of $I_{OUT}$ results in pulldown transistor 87 being turned on, pulling $V_{OUT}$ down to $-10$ volts. This produces a 25 volt collector-to emitter voltage across pullup transistor 80. The current flowing through $R_L$ from ground to conductor 82 is increased to about 2 milliamperes from the quiescent value. The current flowing from conductor 24 through $R_F$ to conductor 82 is about 1 milliampere. The current $I_7$ ($I_3+I_{OL}$) through pulldown transistor 87 is about 3.3 milliamperes. This increase in output current drawn by pulldown transistor 87 causes feedback in the form of an increased voltage across resistor 88 and an essentially equal increase in the voltage across resistor 90, leading to an increase in $I_2$ and a corresponding decrease in $I_1$. More particularly, $I_2$ is increased to about 0.4 milliampere, causing $I_1$, and hence $I_3$, to be reduced to about 3 milliampere. This reduces the voltage between the base of pullup transistor 80 and conductor 82 to about 0.6 volt. Our simulations show that this produces about a 0.5 microampere current in pullup transistor 80, increasing its collector-to-emitter breakdown voltage well beyond the 25 volt collector-to-emitter voltage being applied thereto at the present value of $V_{OUT}$.

As a further example, if the load resistance $R_L$ is increased from 5 kilohms to infinity, then our simulation results show that $I_7$ is about 1.35 milliamperes. The feedback current through $R_F$ is still 1 milliampere. $I_2$ is increased slightly above the quiescent value of 0.35 milliampere, causing $I_1$, and hence $I_3$, to be decreased slightly below the quiescent value of about 0.3 milliampere. The increased voltage across resistor 84 increases $I_4$ to about 40 microamperes. At this condition, the collector-to-emitter breakdown voltage of pullup transistor 80 is still well in excess of the 25 volts being applied thereto.

Next, it is necessary to consider how increasing the operating temperature affects the above described operation of the output stage 69. Increasing the operating temperature decreases the emitter-to-base voltages of the transistors. For example, under the quiescent condition, as temperature increases from room temperature to, say, +125 degrees Centigrade, the $V_{BE}$ of pullup transistor 80 decreases by approximately 200 millivolts. Therefore, $I_{BIAS}$ must be reduced enough to maintain about the same quiescent current in pullup transistor 80 and pulldown transistor 87 as at room temperature.

Figure 3:
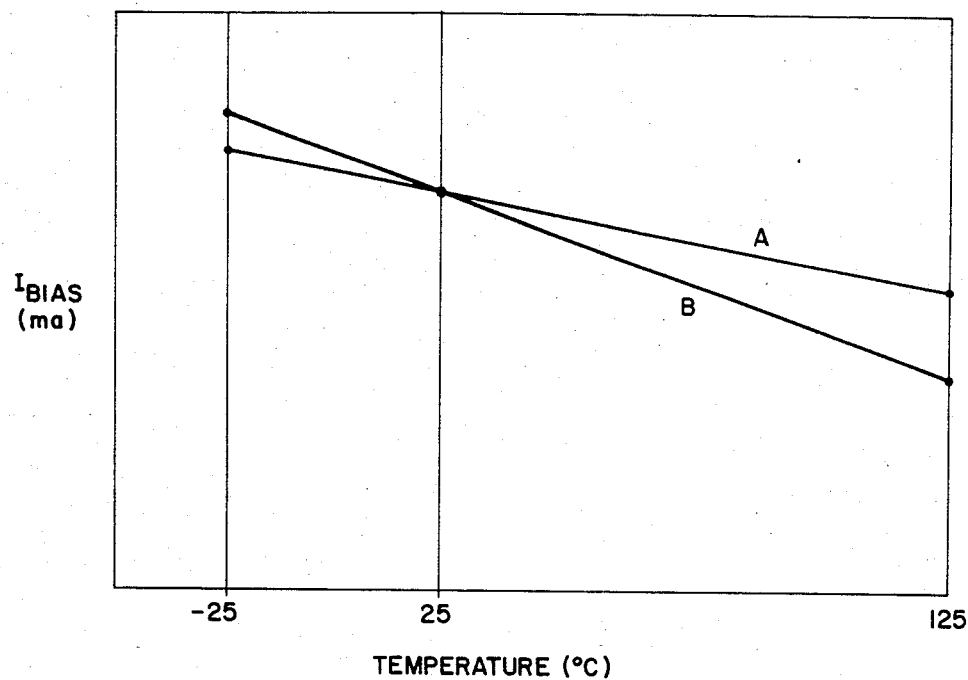
FIG. 3 is a diagram useful in describing the operation of the circuit of FIG. 2

In order to avoid drastic increases in the quiescent currents in the pullup transistor 80 and pulldown transistor 87 as temperature increases, the circuit 70 shown in FIG. 2 decreases $I_{BIAS}$ as temperature increases, generally in accordance with the graph shown in FIG. 3. The PNP current mirror circuit including transistors 74 and 75 causes $I_{BIAS}$ to be twice the current flowing in PNP transistor 75. The manner in which circuit 70 of FIG. 2 decreases $I_{BIAS}$ as temperature increases can be understood by realizing first, that NPN transistor 92 is optional, and only performs the function of protecting transistor 93 from excessive collector-to-emitter voltage, if necessary. The emitter geometries of transistors 93 and 95 are appropriately scaled so that the voltage at the emitter of NPN transistor 93 is essentially equal to the voltage at the emitter of diode-connected transistor 95, over the operating temperature range of $-25$ to $+125$ degrees Centigrade. Hence, the voltage drop across diode connected transistor 96 plus the small voltage drop across resistor 99 is essentially equal to the voltage drop across resistor 94.

Next, it is important to realize that the current mirror circuit 45 of FIG. 1 provides an essentially constant current through conductor 25, which current divides between the path including diode-connected transistors 95 and 96 and the path including resistor 97. As the temperature increases, the emitter-to-base voltages of diode-connected transistors 95 and 96 decrease. This decrease results in a decrease in the voltage across resistor 94, and hence decreases $I_{BIAS}/2$. The upper curve A in FIG. 2 illustrates qualitatively the decrease in $I_{BIAS}/2$ if resistor 97 is omitted; curve A shows a relatively linear decrease in $I_{BIAS}/2$ as temperature increases. Our simulations of circuit operation show that this rate of decrease is not sufficient to maintain constant quiescent currents in the pullup and pulldown transistors 80 and 87. The effect of adding resistor 97 is to accelerate the rate of decrease of $I_{BIAS}/2$ as temperature increases, as indicated by curve B in FIG. 2. Resistor 97 shunts part of the current from conductor 25 away from diode connected transistors 95 and 96, thereby lowering the current density therein.

This decrease in current density increases the rate of $V_{BE}$ change in transistors 95 and 96 with respect to temperature. This results in a greater rate of decrease in the voltage across resistor 94, and thus in $I_{BIAS}/2$, as temperature increases.

The net effect of the bias current circuit 70, then, is to lower $I_{BIAS}$ enough as temperature increases so that the current $I_1$ or $I_2$ conducted by the output transistor (80 or 87) which is supplying or sinking a large output current and its associated resistor (84 or 90) is high enough to "starve" the other output transistor and its resistor (84 or 90), and thereby allow the collector-base reverse leakage current of that starved output transistor to be shunted out of the base of that output transistor. This raises the collector-to-emitter breakdown voltage that starved output transistor from its $BV_{CEO}$ value to a much higher value that depends on the value of the resistor 84 or 90, in accordance with the prior discussion of FIG. 4. The 48 ohm resistor 99 is ratio-matched with 24 ohm resistors 81 and 88 with respect to processing and temperature variations. Resistor 94 is ratio-matched to resistors 84 and 90 with respect to processing and temperature variations. The amount of current supplied into conductor 25 by PNP current mirror circuit 45 of FIG. 1 controls $I_{BIAS}/2$, and hence $I_{BIAS}$.

Therefore, forcing an essentially constant current into diode-connected transistor 96 and 48 ohm resistor 99 controls the voltage across and hence the current through resistor 94, and thereby causes temperature dependent current $I_{BIAS}/2$ to flow in resistor 94. The PNP current mirror circuit 74, 75 doubles this current to produce $I_{BIAS}$, which then is split into curents $I_1$ and $I_2$, to produce proportional, temperature dependent currents to flow in resistors 84 and 90. One skilled in the art will recognize that these currents produce voltages that cause transistor 80 and resistor 81 to produce an essentially constant, relatively temperature-independent current $I_4$, and cause transistor 87 and resistor 88 to produce an essentially constant, temperature-independent current $I_7$. Analagous operation occurs under non-quiescent conditions, and at high or low temperatures, the collector current in the output transistor not supplying or sinking output current is so low that its collector-to-emitter breakdown voltage is raised to a safe value.

The operation of the level shifting circuit 14 in FIG. 1 will now be described. A low TTL level of $V_A$ applied to conductor 2 is shifted up by the emitter-to-base voltage of diode connected transistor 15, and then is applied to the base of emitter follower transistor 18, the emitter of which is at essentially $V_A$ volts. A level shifting resistor 19, which is ratio-matched with resistor 41, produces a voltage shift of about 2 volts, and applies the shifted low TTL input voltage to the base of bit current switch transistor 5. If $V_A$ is "high", then $V_{REF1}$ is applied to the base of transistor 18 (because diode 15 is turned off) and the level of $V_{REF1}$ is shifted by resistor 19. The problem, given a value of $-V_{CC}$ as small as $-4.75$ volts, considering the constraints on the values of $V_{B1}$ and $V_{B2}$, is how to keep the voltage drop across level shifting resistor 19 essentially constant over a normal range of processing parameter variations and temperature variations from $-25$ to $+125$ degrees Centigrade. If this compensation for processing parameter variations and temperature variations cannot be achieved, the level shifting technique of circuit 14 is not practical for use in a low voltage DAC.

The manner in which the current $I_{LS}$ (i.e., the level shifting current) is varied to keep the voltage drop across resistor 19 essentially constant, is to drive the NPN current mirror circuit 31 by means of PNP current mirror circuit 32, whose input current is determined by transistor 38, resistor 40, and the reference voltage on conductor 39.

Those skilled in the art will recognize that level shifting resistor 19 may have resistance variations therein due to variations in the various nichrome etching processes by which resistor 19 is formed and also due to variations in the various parameters which define the resistivity of resistor 19. Accordingly, resistor 40, which is ratio-matched to and has the same width and terminal structure as resistor 19, is utilized to generate the current through PNP current mirror circuit 32, so that any process-induced variations in the resistance of resistor 19 are matched by corresponding variations in the current produced by resistor 40 for PNP current mirror circuit 32, and hence also in NPN current mirror circuit 31, and hence in $I_{LS}$.

In order to provide the capability of adjusting the bit current $I_{BIT}$ by means of external potentiometer 48, the circuit 78 in FIG. 1 causes the current $I_{ADJ}$ to be essentially constant as temperature changes and as $+V_{CC}$ or $-V_{CC}$ changes. A problem encountered in the design of the circuit was how to accomplish this capability and also provide a very low noise bias voltage $V_{B2}$ on conductor 13, using only a single lead of the package in which DAC 1 is housed. The voltage produced on conductor 49 is appropriately temperature compensated, by virtue of the negative temperature coefficient of the emitter-to-base voltages of diode-connected NPN transistors 64 and 66, and the $V_{s3}$ multiplier 53 and the positive temperature coefficient of zener diode 65. Zener diode 65 produces an unacceptably large amount of noise on the reference voltage conductor 67 for a high accuracy DAC, such as a 16 bit DAC, so it is desirable to provide an external capacitor to filter out that noise before using the reference voltage to produce the voltage $V_{B2}$ on conductor 13.

Ideally, the best high impedance point for connection of an external filter capacitor would be to connect it at the base of emitter follower transistor 51. Then, the high value of resistance (resistors 59 and 61) between base of that emitter follower transistor 51 and the high noise reference voltage on conductor 67 would, in combination with the filter capacitor, form a low pass RC filter.

The ideal place for connecting an external potentiometer such as 48 would be to connect it to an emitter follower transistor (not shown) having its base electrode referenced to conductor 67.

Unfortunately, this "ideal" approach requires two package leads. Attaching an external potentiometer such as 48 to the base of emitter follower transistor 51 (the ideal point for connecting an external filter capacitor) would result in unacceptable loading of conductor 60, causing variation in $V_{B2}$.

The circuit shown in FIG. 1 resolves these conflicting requirements effectively by providing a 500 ohm resistor 61 between the emitter of emitter follower transistor 62 and conductor 49. This 500 ohm resistance prevents external filter capacitor 50 from being presented with the very low emitter resistance of emitter follower transistor 62, and allows effective filtering of the noise on conductor 49 with a relatively small capacitor having a value of roughly 0.1 microfarad. For values of resistance for potentiometer 48 of 1 megohm or greater, the effective loading on conductor 49 is negligible.

While the invention has been described with reference to a particular embodiment thereof, those skilled in the art will be able to make various modifications to the described embodiments without departing from the spirit and scope of the invention. For example, if $V_{B1}$ on conductor 70 of FIG. 1 is made to vary with temperature in a predetermined manner, the essentially constant level shift across level shifting resistor 19 can be made to vary in the same manner.

I Claim:

1. In a digital-to-analog converter including
   i. a plurality of bit circuits, each including a resistor determinative of a bit current for that bit circuit flowing through a current source transistor having an emitter connected to the resistor and a collector connected to a bit current switch circuit responsive to a digital input signal to switch that bit current into a summing conductor, the bit current switch circuit including first and second transistors with their emitters coupled to the collector of the current source transistor, and
   ii. a bias circuit producing a bias voltage and applying it to the base of the second transistor of each of the bit current switch circuits,
   the improvement in each bit circuit comprising the combination of:
   (a) an input diode having its cathode responsive to the digital input signal and its anode coupled to a pullup resistor and the base of a third transistor;
   (b) a level shifting resistor having one terminal coupled to the emitter of the third transistor and a second terminal coupled to the base of the first transistor of the bit current switch circuit; and
   (c) compensating current source means coupled to the second terminal of the level shifting resistor for causing a level shifting current to flow through the level shifting resistor and varying the level shifting current to cause it to produce an essentially constant voltage drop across the level shifting resistor despite variations in the resistance of the level shifting resistor due to variations in temperature and manufacturing parameters.

2. In a digital-to-analog converter, the improvement of claim 1 wherein the first, second, and third transistors are NPN transistors.

3. In a digital-to-analog converter, the improvement of claim 2 wherein the compensating circuit means include an NPN current mirror circuit including a fourth NPN transistor having its base connected to the base of a fifth NPN transistor, the emitter of the fourth and fifth NPN transistors being coupled to a first power supply voltage conductor, wherein the level shifting current flows in the collector of the fourth NPN transistor in response to a first control current flowing in the collector of the fifth NPN transistor.

4. In a digital-to-analog converter, the improvement of claim 3 wherein the compensating circuit means includes a PNP current mirror circuit including a first PNP transistor having its base connected to the base of a second PNP transistor, the first and second PNP transistors having their emitters coupled to a second power supply voltage conductor, the first control current also flowing in the first PNP transistor in response to a second control current flowing in the collector of the second PNP transistor.

5. In a digital-to-analog converter, the improvement of claim 4 wherein the compensating circuit means includes means for providing a reference voltage on a reference voltage conductor, a sixth NPN transistor having its base connected to the reference voltage conductor and its emitter coupled to one terminal of a current control resistor, the other terminal of the current control resistor being coupled to the first power supply voltage conductor, the current control resistor being of the same type as the level shifting resistor and being ratio-matched thereto, the sixth NPN transistor cooperating with the current control resistor and the first power supply voltage to produce the control current in the current control resistor.

6. A method of switching bit currents in a digital-to-analog converter circuit, the method comprising the steps of:
   (a) applying an input level to one terminal of an input switch circuit to produce a first or second signal level at a second terminal of the input switch;
   (b) applying the signal level at the second terminal of the input switch circuit to the base of a first transistor having its emitter connected to a level shifting resistor;
   (c) conducting a level shifting current through the level shifting resistor to produce an essentially constant voltage drop across the level shifting resistor, and adjusting the level shifting current to compensate for variations in the resistance of the level shifting resistor due to variations in temperature and variations in manufacturing parameters of the level shifting resistor to ensure that the voltage drop is essentially independent of such variations.

7. The method of claim 6 including producing a control current by producing an essentially constant voltage drop across a control resistor that is of the same type as the level shifting resistor and is ratio-matched to the level shifting resistor, and using the control current to drive current mirror circuitry which produces the level shifting current.

* * * * *

UNITED STATES PATENT AND TRADEMARK OFFICE
CERTIFICATE OF CORRECTION

PATENT NO. : 4,607,249
DATED : August 19, 1986
INVENTOR(S) : Jimmy R. Naylor

It is certified that error appears in the above-identified patent and that said Letters Patent is hereby corrected as shown below:

Column 12, line 22, delete "$V_{53}$", substitute --$V_{BE}$--.

Signed and Sealed this

Eighteenth Day of August, 1987

Attest:

DONALD J. QUIGG

Attesting Officer

Commissioner of Patents and Trademarks